United States Patent [19]

White, Jr. et al.

[11] 4,207,618

[45] Jun. 10, 1980

[54] ON-CHIP REFRESH FOR DYNAMIC MEMORY

[75] Inventors: Lionel S. White, Jr.; G. R. Mohan Rao, both of Houston, Tex.

[73] Assignee: Texas Instruments Incorporated, Dallas, Tex.

[21] Appl. No.: 918,891

[22] Filed: Jun. 26, 1978

[51] Int. Cl.² ............................................. G11C 7/00
[52] U.S. Cl. ................................................... 365/222
[58] Field of Search ........................ 365/222, 149, 205

[56] References Cited

U.S. PATENT DOCUMENTS

| | | | |
|---|---|---|---|
| 3,729,722 | 4/1973 | Shuba | 365/222 |
| 4,006,468 | 2/1977 | Webster | 365/222 |
| 4,050,061 | 9/1977 | Kitagawa | 365/222 |

*Primary Examiner*—Stuart N. Hecker
*Attorney, Agent, or Firm*—John G. Graham

[57] ABSTRACT

A semiconductor device comprises an array of rows and columns of dynamic-type memory cells with on-chip refresh circuitry including an address counter and a multiplexer to insert the refresh address when a system command is received indicating a refresh cycle. The refresh address counter is incremented after each refresh cycle. If a refresh command is not present, the device is accessed in the usual manner.

10 Claims, 4 Drawing Figures

ON-CHIP REFRESH FOR DYNAMIC MEMORY

BACKGROUND OF THE INVENTION

This invention relates to semiconductor memory devices and more particularly to a dynamic memory device which functions almost as a static memory device.

The most widely used semiconductor memory devices at present are one-transistor dynamic memory cells as described in U.S. Pat. No. 3,940,747, issued Feb. 24, 1976 to Kuo and Kitagawa, assigned to Texas Instruments. Higher density versions of these dynamic memory systems are shown in Electronics, May 13, 1976, pp. 81–86 and U.S. Pat. No. 4,081,701, assigned to Texas Instruments. These high density devices use one-transistor dynamic memory cells which have the advantage of very small size, and thus low cost, but have the disadvantage of requiring external refresh systems. Each row of an array of cells must be addressed periodically to restore the data, since the stored voltages will leak off the capacitors in the memory cells. Refresh imposes both time and hardware burdens on the system.

Usually refresh is accomplished by sequentially accessing a bit in a row of a dynamic RAM in either a burst refresh mode where consecutive access cycles are used to refresh all rows, or in a distributed refresh mode where the refresh cycles are distributed over the entire refresh period. In either case, the memory system requires a counter (eight bits long for 256 rows, for example) for the refresh address, a system interrupt mechanism to allow the refresh to occur, and a timer to indicate when refresh should occur, whether burst or distributed mode is used. In a large memory system the overhead circuitry to provide the refresh control is a small part of the system cost, so dynamic RAMs are widely used in medium to large memory systems. However, in small memory systems of the type usually associated with small minicomputers and microprocessors the refresh control circuitry is a significant portion of the system cost, so static RAMs are most often substituted for dynamic RAMs. A single-board microcomputer, for example, may need to use one third of the board space for refresh control.

The typical static RAM cell requires six transistors, or four transistors and two polysilicon resistors, so the cell size is much greater than the one transistor and one capacitor used in dynamic RAMs. Static cells which provide reduced area are shown in U.S. Pat. No. 4,110,776, and application Ser. No. 601,699 filed May 31, 1977 now U.S. Pat. No. 3,994,919, all assigned to Texas Instruments. Various types of "self-refreshing" cells have been demonstrated, such as in U.S. Pat. No. 3,955,181 issued to Joseph H. Raymond, Jr., U.S. Pat. No. 4,092,735 issued to David J. McElroy, and U.S. Pat. No. 4,070,653 issued to Rao, Rogers and McElroy, all assigned to Texas Instruments. These self refresh cells provide apparently static operation in that refresh is accomplished without addressing the cells. Still, the cell size and cost per bit have not reached that of dynamic RAMs.

It is a principal object of this invention to provide improved memory systems and devices made in semiconductor integrated circuits. Another object is to provide an improved "static" type MOS memory device, particularly a memory device of small cell size and not requiring elaborate refresh inputs. An additional object is to provide small area pseudo static memory elements in semiconductor integrated circuits, particularly memory devices employing dynamic cells arrays with almost all of the refresh overhead incorporated on the same chip.

SUMMARY OF THE INVENTION

In accordance with an embodiment of this invention, a memory device is provided which includes a refresh address counter and address multiplexing circuitry on a dynamic RAM chip of standard form. The only external signal needed is a refresh command which causes the on-chip refresh to access a row as defined by the counter and to increment the counter. In large part, the system control circuitry is eliminated so the dynamic RAM can be economical for small memory systems.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
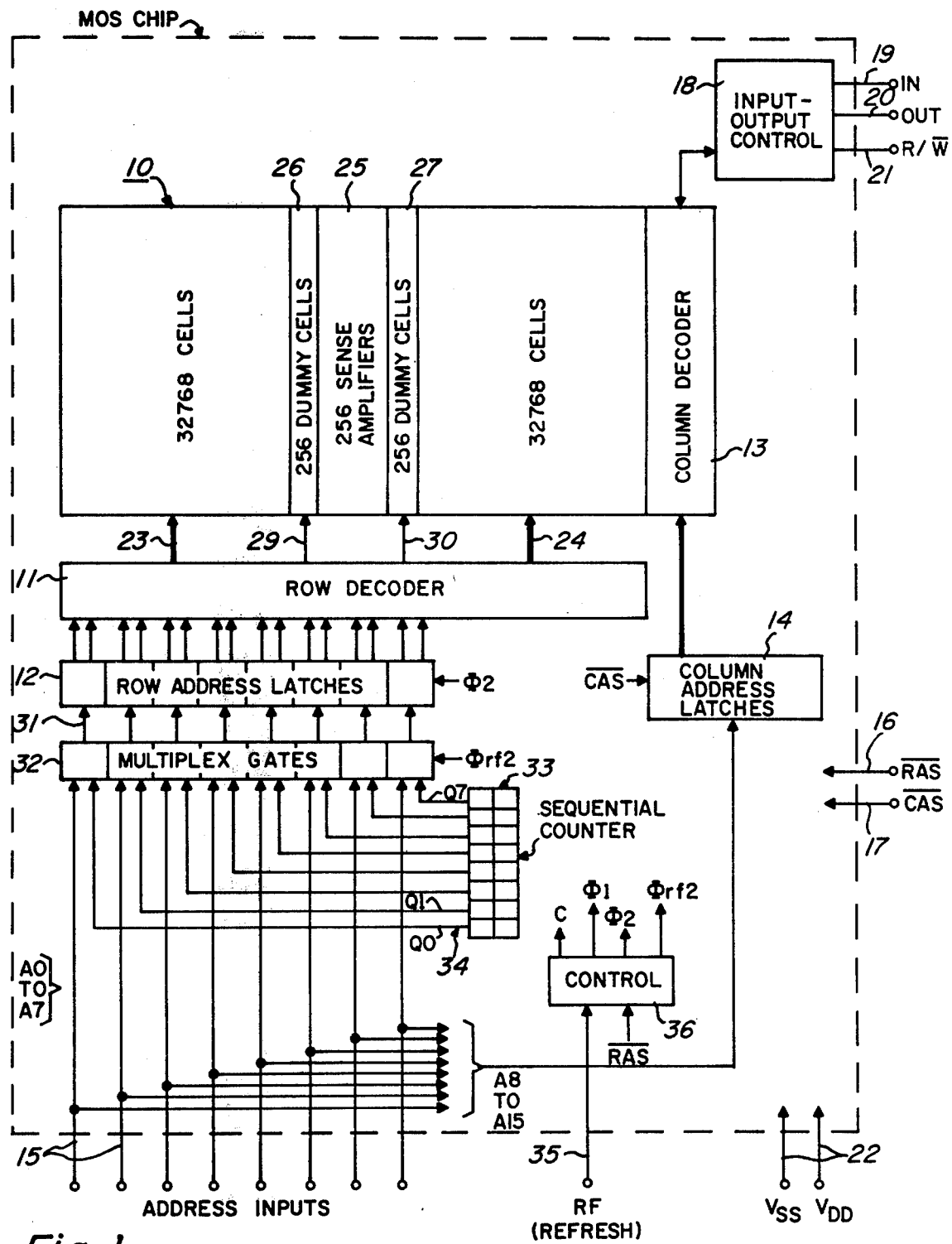
FIG. 1 is an electrical diagram in a block form of a memory device including the on-chip refresh of the invention.

A memory device which may use the invention is shown in FIG. 1. The concept of the invention is particularly useful in very high density memory devices containing, for example, 65,536 or 261824 cells on one silicon chip of about one-twentieth square inch. This type of device may be made by an N-channel silicon-gate self-aligned MOS process which is described in U.S. patent applications Ser. No. 648,594, filed Jan. 12, 1976, or Ser. No. 722,841, filed Sept. 13, 1976 by C-K Kuo, both assigned to Texas Instruments. In this embodiment the device consists of an array 10 of 65,536 memory cells generally divided into 256 rows and 256 columns; each cell is a so-called one-transistor cell of the type shown in said applications Ser. No. 648,594, or Ser. No. 722,841. A row decoder 11 selects one of the 256 row lines as determined by a row or X address contained in an eight-bit row address latch 12, and a column decoder 13 selects one of the 256 column lines as determined by a column or Y address contained in an eight-bit column address latch 14. For normal operation these addresses are applied to the chip eight address lines 15 on a time-share basis, while for refresh the row address is internally generated. When an $\overline{RAS}$ or row address strobe input 16 (seen in FIG. 2a) is at logic "0" or zero volts, the row address buffers 12 enabled at $\Phi 2$ for normal operation to accept row address bits A0 to A7 from the line 15. During a refresh operation, the row address latch accepts a refresh address as will be explained. $\overline{CAS}$ or column address strobe input 17 (seen in FIG.

2b) at logic "0" or zero volts enables the column address buffer 14 to accept a column address (bits A8 to A15) from the lines 15. The row column addresses must be valid on the pins 15 during the time periods shown in FIG. 2c. Sixteen address bits are needed to uniquely define one bit of 65,536 cells ($2^{16}=65,536$). Input/output control circuitry 18 may be connected to the array 10 via column decoder 13, and functions to apply data to the column lines from a data input pin 19, or to detect data on the column lines and apply it to a data output pin 20, under control of a read/write R/W input 21 as well as under control of various internally generated clock and logic voltages. Alternatively, a single bidirectional I/O port may be used in place of the separate input and output ports 19 and 20. The device requires supply voltages on pins 22; these usually include a Vdd supply voltage of +5 V. as well as ground or Vss. Of course, some circuits are designed to operate on two or three supply voltages rather than one. The decoder 11 is of conventional design and functions to select one of 128 row lines 23 on the left or one of 128 row lines 24 on the right of a set of 256 sense amplifiers 25. The selected row line goes high after $\Phi 2$, in FIG. 2e, to logic "1", and the remaining 255 remain low. A7, the MSB of the row address, selects right or left side and also determines activation of a row of dummy cells 26 or 27 on the opposite side of the sense amplifiers from the selected memory cell via lines 29 or 30. The sense amplifiers 25 located in the center of each column line are usually bistable circuits as described in detail in the above mentioned U.S. Pat. Nos. 3,940,747, 4,050,061, or 4,081,701.

According to the invention, the row decoder 11 receives at its inputs 31 either a normal address from the input terminals 15 or a refresh address, this selection being made by eight multiplex gates 32. Each of these gates 32 is responsive to a refresh clock $\Phi rf2$ which causes a gate to apply a refresh address bit Q to the decoder 11. When the clock $\Phi rf2$ is not present, the normal address from the input 15 passes through the eight multiplex gates 32 to the decoder 11. The refresh address is generated in a sequential counter 33 which produces an eight bit address on lines 34 that sequences through the 256 possible row addresses, one at a time. The addres in the sequential counter changes each time RF signal appears on a chip input pin 35. A control circuit 36 receives the refresh signal RF and an enable signal $\overline{RAS}$ from pin 16 and produces the $\Phi rf2$ clock as well as other controls.

Figure 3:
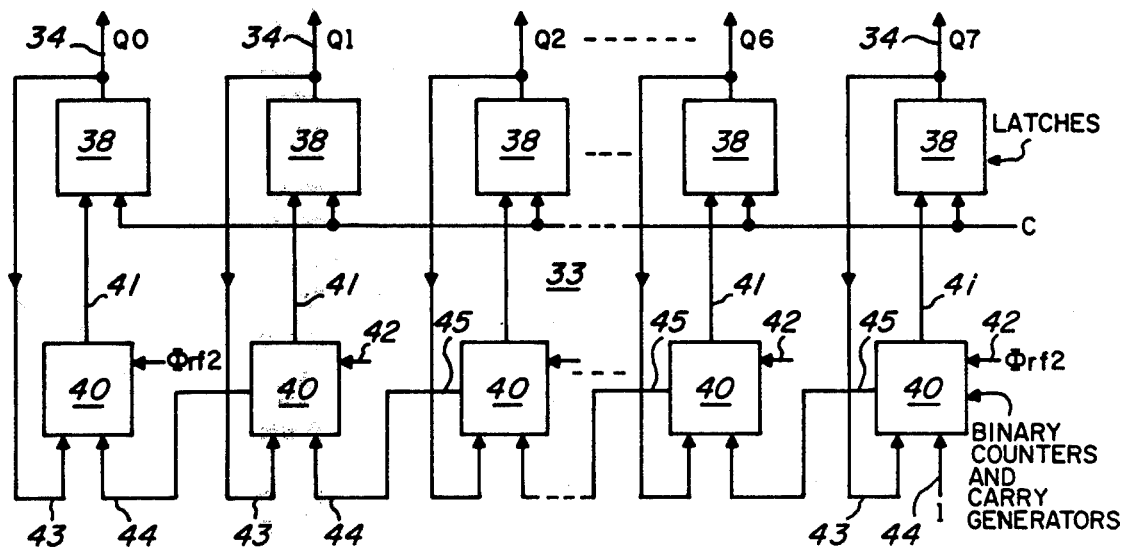
FIG. 3 is an electrical diagram in block form of details of a refresh address counter of the system of FIG. 1.

The rows must be addressed in some sequence, one at a time, so that each of the rows is addressed within the maximum refresh time of the memory device, which may be several milliseconds. The column address is not needed; if present is superfluous. Various types of counters which advance one count for each input clock may be used. The address sequence need not advance in order, so long as no address is repeated; thus a pseudo-random shift counter as seen in U.S. Pat. No. 4,074,355 might be used. An example of a counter which advances in regular numerical sequence is seen in FIG. 3. The counter includes eight latches 38 (clocked D type flip flops) which hold the refresh address generated in a series of eight binary adder or counter stages 40. Each adder stage is a standard logic circuit which produces a one or zero on an output 41 when a clock $\Phi rf2$ is present at a clock input 42, in response to binary inputs 43 and 44. Each input 43 is connected to the output 34 of the associated latch 38, and each input 44 is connected to receive a carry output 45 from the preceeding stage 40; the input 44 of the first stage 40 is connected to logic "1" so it always has a carry input. The latches 38 can change only if a clock C is present; this clock is generated in the control circuit 38 and occurs at the end of a cycle when the refresh signal RF has occured and the ordinary chip clock $\overline{\Phi}$ goes to "1." The latches 38 will then receive the address on the lines 41 and will remain in this state until after another refresh signal. When $\Phi 2rf$ goes high the counter stages 40 ripple through to the next count before C occurs. When a refresh signal RF occurs, the address applied to the decoder 11 via lines 34 and multiplexers 32 is that which was generated in the counter stages 40 at the previous refresh signal, then stored in the latches 38 after $\overline{\Phi}$ went high.

Figure 2:
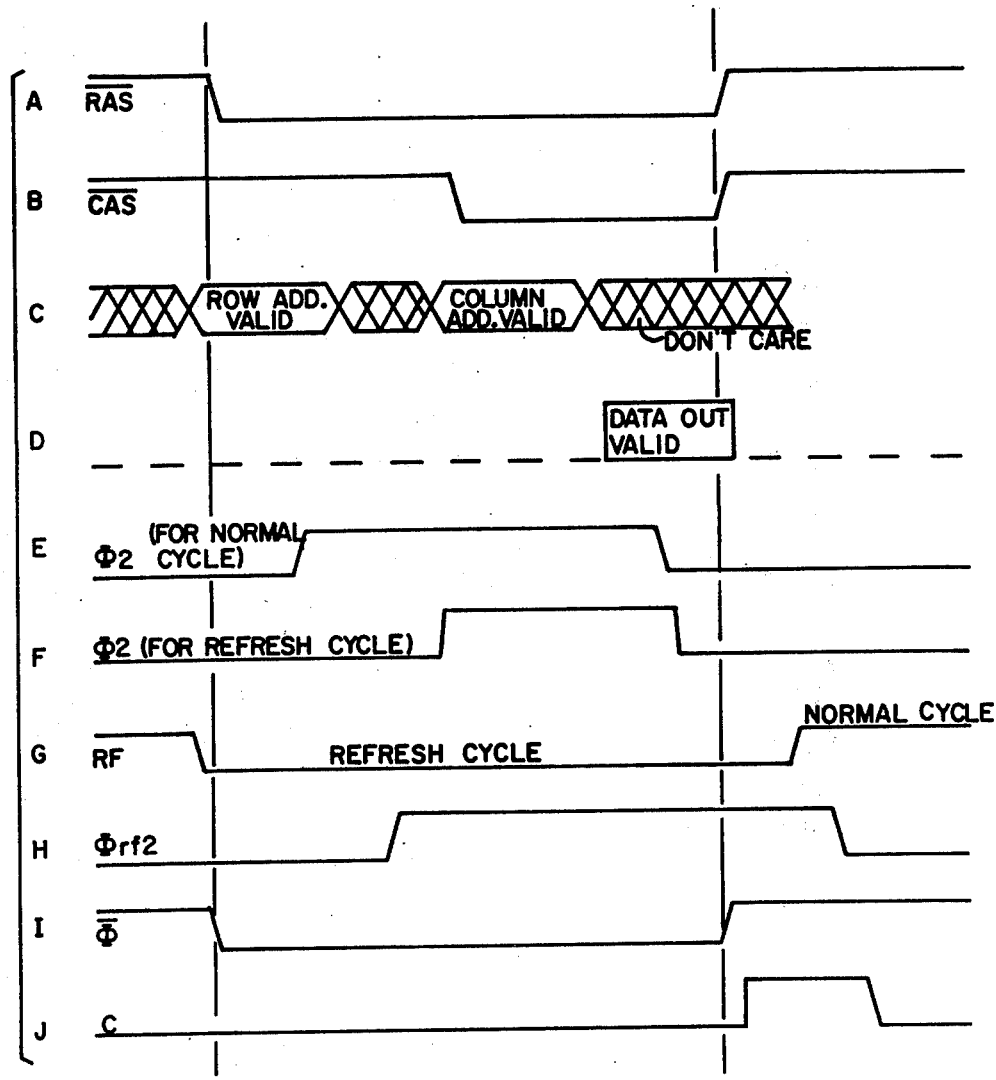
FIGS. 2a–2h are graphic representations of voltage vs. time for electrical waveforms or signals appearing in the system of FIG. 1.
Figure 4:
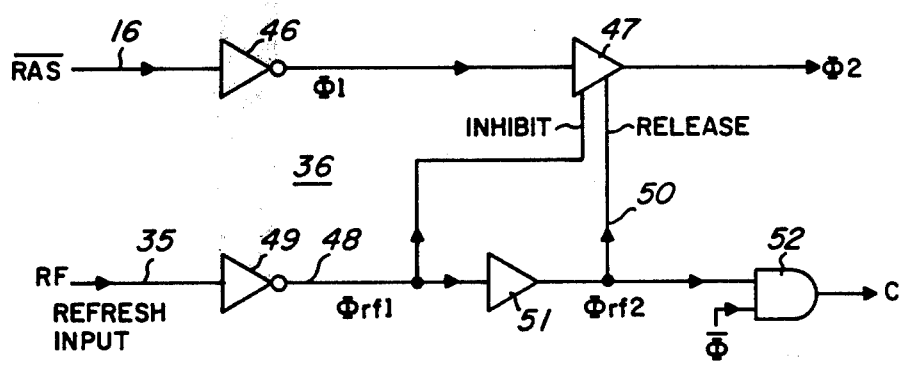
FIG. 4 is an electrical diagram in block form of details of the control circuitry of the system of FIG. 1.

Referring to FIG. 4, the control circuit 38 is shown in detail. The $\Phi 1$ and $\Phi 2$ clocks which are used in the sense amplifiers 25 and at other points in the memory device are generated from the $\overline{RAS}$ signal on line 16 by an inverter 46 which introduces a slight delay, and a logic gate 47 which introduces further delay. The $\Phi 2$ signal is seen in FIG. 2e. When an RF signal is present on the line 35, an inhibit signal $\Phi rf1$ is generated on a line 48 by an inverter 49. This inhibits the logic gate 47 from producing $\Phi 2$ until a release signal $\Phi rf2$ occurs on a line 50 at the output of a delay circuit 51. Thus $\Phi 2$ does not occur until slightly after $\Phi rf2$ has triggered the multiplexers 32 to gate in refresh address from the lines 31. The signal $\Phi rf2$ also is applied to a gate 52 along with $\overline{\Phi}$ to produce the refresh clock C.

In the embodiment described above an asynchronous, ripple-through adder is described using the stages 40. As alternatives, a synchronous adder or an adder with a carry look ahead could be used. However, the synchronous adder would either require an on-chip multivibrator to provide the clock signals, or require that multiple memory cycles occur before the next refresh address could be generated. The carry look ahead approach would require considerable additional circuitry and connecting lines.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A semiconductor memory device comprising an array of memory cells in a single integrated circuit formed in a semiconductor body, the memory device having a refresh address counter included within said body along with means for incrementing the counter and addressing means for alternatively receiving an address from inputs to the device or from the counter and for accessing the array using said address.

2. A device according to claim 1 wherein the counter comprises a plurality of stages with each stage including a static adder and a latch.

3. A device according to claim 2 wherein the memory cells are of the dynamic type and refresh is provided according to a regular timing sequence.

4. A device according to claim 1 wherein a timing clock is applied to the memory device for each access cycle and wherein means are provided for delaying the clock when the addressing means is receiving an address from the counter.

5. A device according to claim 1 wherein the memory cells are of the dynamic type and refresh is provided according to a regular timing sequence.

6. A device according to claim 5 wherein the cells are in an array of rows and columns, and only the rows are addressed from said address counter.

7. A device according to claim 6 wherein the counter has a number of bits determined by the number of rows in the array and each bit includes an adder and a bistable circuit.

8. A device according to claim 7 wherein the memory array has a sense amplifier for each column and timing signals are applied to the sense amplifiers to control sensing operations during access cycles, and wherein means are provided for delaying the timing signals when addresses are received from the counter.

9. A device according to claim 8 wherein the timing signals are based on an enable signal received from a generator external to the semiconductor body.

10. A device according to claim 1 along with a processing system including means external to the integrated circuit for generating a refresh command signal and coupling it to the integrated circuit wherein said signal is applied to the addressing means to cause the address to be received from the counter and is applied to the means for incrementing the counter.

* * * * *

REEXAMINATION CERTIFICATE (1035th)
United States Patent [19]
White, Jr. et al.

[11] B1 4,207,618
[45] Certificate Issued Apr. 18, 1989

[54] ON-CHIP REFRESH FOR DYNAMIC MEMORY

[75] Inventors: Lionel S. White, Jr.; G. R. Mohan Rao, both of Houston, Tex.

[73] Assignee: Texas Instruments Incorporated, Dallas, Tex.

Reexamination Request:
No. 90/001,563, Jul. 21, 1988

Reexamination Certificate for:
Patent No.: 4,207,618
Issued: Jun. 10, 1980
Appl. No.: 918,891
Filed: Jun. 26, 1978

[51] Int. Cl.⁴ .................................. G11C 7/00
[52] U.S. Cl. .................................... 365/222

[56] References Cited
U.S. PATENT DOCUMENTS

| | | | |
|---|---|---|---|
| 3,930,239 | 12/1975 | Salters et al. | 340/173 |
| 4,040,122 | 8/1977 | Bodin | 364/900 |
| 4,110,639 | 8/1978 | Redwine | 307/279 |
| 4,112,514 | 9/1978 | Spoelder | 365/222 |

OTHER PUBLICATIONS

Faggin F. and M. E. Hoff, "Standard Parts and Custom Design Merge In Four-Chip Processor Kit", *Electronics*, Apr. 24, 1972, pp. 112–115.

Tourangeau, Ray E., "Need A Low-Cost, Versatile Custom Test System? Use A Microprocessor", *EDN*, Feb. 5, 1974, pp. 58–65.

"A New, Easy And Inexpensive Way To Develop Microcomputer Systems", *Intel Ad Reprint*, Jun., 1973, pp. 6–8.

"320 Bit RAM And 4 Bit Output Port", *Intel Data Book*, pp. 5–113 to 5–118 and Single Chip 4–Bit P-Channel Microprocessor, *Intel Data Book*, pp. 5–1, to 5–9.

*Primary Examiner*—Terrell W. Fears

[57] ABSTRACT

A semiconductor device comprises an array of rows and columns of dynamic-type memory cells with on-chip refresh circuitry including an address counter and a multiplexer to insert the refresh address when a system command is received indicating a refresh cycle. The refresh address counter is incremented after each refresh cycle. If a refresh command is not present, the device is accessed in the usual manner.

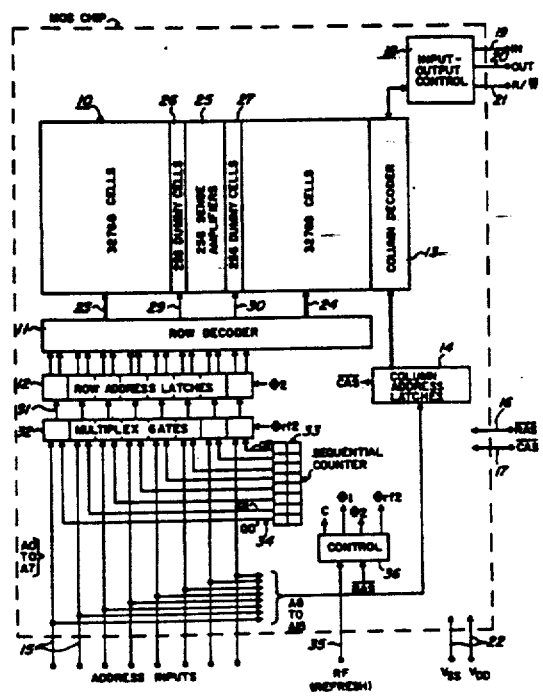

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-10 is confirmed.

New claims 11-22 are added and determined to be patentable.

*11. A semiconductor memory device comprising an array of rows and columns of one-transistor dynamic memory cells in a single integrated circuit formed in a semiconductor body, comprising:*

*a plurality of inputs for receiving addresses and control signals;*

*the memory device having a refresh address counter included within said body along with means for incrementing the counter; and*

*addressing means for alternatively receiving an address for the rows of the array from address inputs applied to some of said inputs of the device or from the counter and for accessing the rows of the array using said address, the addressing means receiving a first of said control signals from one of said inputs of said device for initiating an operating cycle for said addressing of the array, and the addressing means selecting between said alternatives of inputs to the device or the counter in response to a second of said control signals existing when said first of said control signals occurs.*

*12. A device according to claim 11 wherein the counter comprises a plurality of stages with each stage including a static adder and a latch.*

*13. A device according to claim 12 wherein refresh is provided according to a regular timing sequence established by said first and second of said control signals.*

*14. A device according to claim 11 wherein said first of said control signals is a timing clock which is applied to the memory device for each access cycle and wherein means are provided in said memory device for delaying the clock when the addressing means is receiving an address from the counter.*

*15. A device according to claim 11 wherein refresh is provided according to a regular timing sequence established by said first and second of said control signals.*

*16. A device according to claim 15 wherein the cells are in an array of rows and columns, and only the rows are addressed from said address counter.*

*17. A device according to claim 16 wherein the counter has a number of bits determined by the number of rows in the array and each bit includes an adder and a bistable circuit.*

*18. A device according to claim 17 wherein the memory array has a sense amplifier for each column and timing signals are applied to the sense amplifiers to control sensing operations during access cycles, and wherein means are provided for delaying the timing signals when addresses are received from the counter.*

*19. A device according to claim 18 wherein the timing signals are based on said first of said control signals received from a generator external to the semiconductor body.*

*20. A device according to claim 11 along with a processing system including means external to the integrated circuit for generating said second of said control signals and coupling it to the integrated circuit wherein said signal is applied to the addressing means to cause the address to be received from the counter and is applied to the means for incrementing the counter.*

*21. A device according to claim 11 wherein said addressing means includes means for receiving an address for columns of the array from addresses applied to said inputs of the device, and said addressing means receiving a column address control signal from one of said inputs for initiating accessing columns of the array.*

*22. A device according to claim 1 wherein said addressing means includes means for receiving an address for columns of the array from addresses applied to said inputs of the device, and said addressing means receiving a column address control signal from one of said inputs for initiating accessing columns of the array.*

* * * * *